United States Patent [19]

Marcantonio et al.

[11] 4,339,628
[45] Jul. 13, 1982

[54] RF SHIELDING SUPPORT FOR STACKED ELECTRICAL CIRCUIT BOARDS

[75] Inventors: Gabriel Marcantonio; David M. Macklem, both of Ottawa, Canada

[73] Assignee: Northern Telecom Limited, Montreal, Canada

[21] Appl. No.: 179,799

[22] Filed: Aug. 20, 1980

[51] Int. Cl.³ .............................................. H05K 1/14
[52] U.S. Cl. .................................. 174/35 R; 361/396; 361/412; 361/424
[58] Field of Search ................. 174/35 R, 35 M, 35 S; 361/395, 396, 399, 415, 424, 393, 412, 414

[56] References Cited

U.S. PATENT DOCUMENTS

| 3,368,150 | 2/1968 | Worcester | 361/424 |
| 3,876,822 | 8/1975 | Davy | 361/424 |
| 4,063,788 | 12/1977 | Latasiewicz | 361/395 |
| 4,203,147 | 5/1980 | Gabr | 361/424 |

FOREIGN PATENT DOCUMENTS

| 1073108 | 6/1967 | United Kingdom | 174/35 R |
| 1324560 | 7/1973 | United Kingdom | 174/35 R |

Primary Examiner—Gerald P. Tolin
Attorney, Agent, or Firm—Stuart L. Wilkinson

[57] ABSTRACT

A combined supporting arrangement and RF shield for stacked circuit boards has several conducting shields, each shield covering a respective circuit board and having an edge flange, part of the flange being turned under to space a particular circuit board from the next lower circuit board in the stack, and part of the flange being turned out to engage a clamp projecting from a baseboard, the clamp being common to all the shields.

9 Claims, 2 Drawing Figures

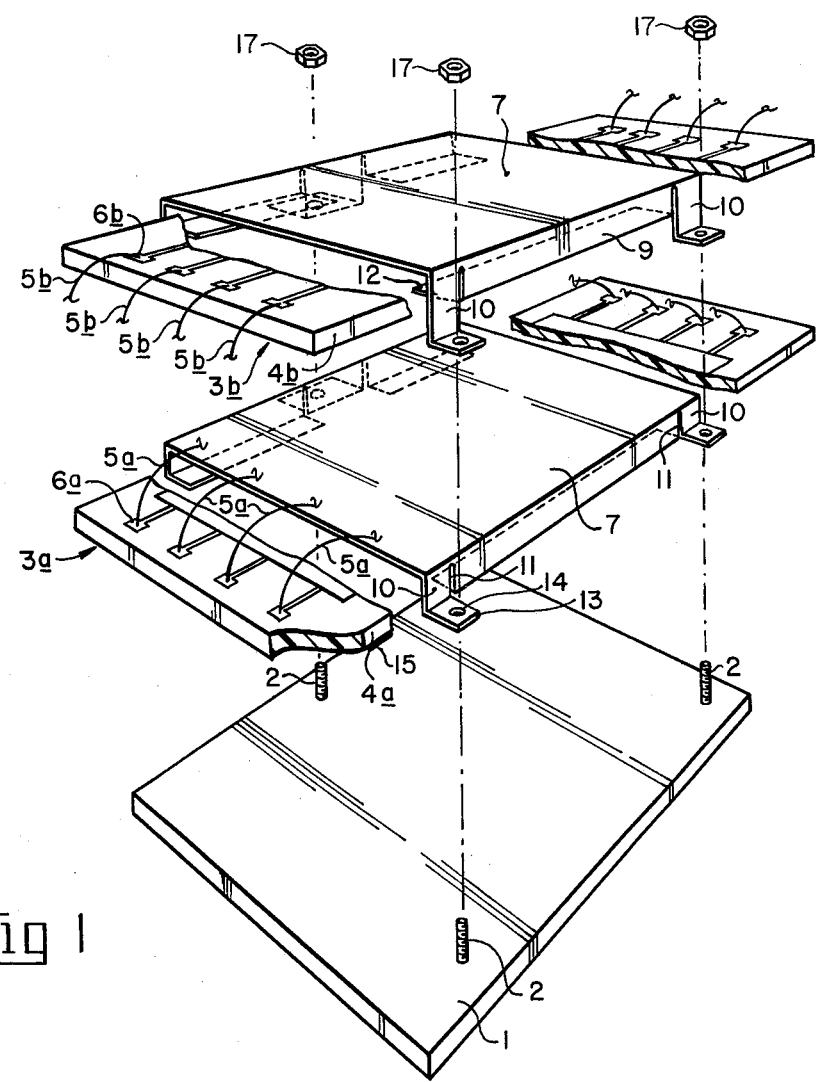
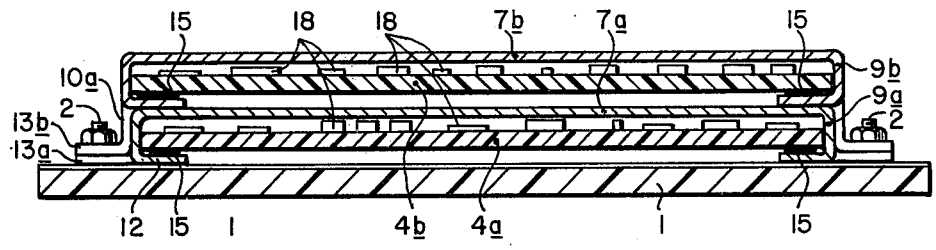

RF SHIELDING SUPPORT FOR STACKED ELECTRICAL CIRCUIT BOARDS

This invention relates to a combined electromagnetic interference shield and support system for stacked circuit boards, particularly for stacked hybrid circuits of a mobile radio which are subject both to vibration and to location within a strong radio field.

Small scale production and custom requirements for mobiles often result in electronics having a number of hybrid circuit boards supporting a variety of discrete, thick-, and thin-film components incorporating active and passive devices.

In the past the problems of radio interference and circuit board support seem generally to have been addressed separately. To inhibit radio frequency interference, typically a circuit board substrate of, for example, alumina has been used, the substrate having a conductive aluminum layer on its undersurface which functions both as a shield and ground plane. To support stacked hybrid circuit boards, clamps which prevent relative movement between boards have been used. However, owing to warpage, camber and expansion of individual boards, interconnection leads extending between adjacent boards may be placed under appreciable tensile and torsional stresses with consequent variation in device operating values. In an alternative known structure, compression springs are used in place of clamps. The springs act against board surfaces to establish a set spacing and, by permitting a modicum of lateral movement, accommodate thermal mismatch. One problem with this construction is that the boards, when subjected to vibration, tend to undergo lateral translational movement relative to one another causing untenable stresses in the interconnecting leads. An inherently resilient polymer adhesive between boards has also been tried and proven effective in compensating for the effects of warpage, camber and thermal mismatch. However, use of adhesive is inconvenient if board replacement or repair is necessary since separating the boards is time consuming as is subsequent stripping of residual adhesive.

To overcome these problems, the invention provides in its broadest aspect a combined supporting arrangement and electromagnetic interference shield for a plurality of circuit boards, comprising a baseboard, first fixture means formed on said baseboard, a plurality of circuit boards stacked on the baseboard, each circuit board having associated therewith a respective shield of conductive sheet material, each shield having flanges depending from opposed edge parts thereof, the flanges having turned-under parts to embrace opposed edge parts of the associated circuit board and to space the associated circuit board from an immediately underlying board, and having turned-out parts formed with second fixture means to engage said first fixture means thereby to clamp the shield to the baseboard.

An embodiment of the invention will now be described by way of example with reference to the accompanying drawings in which:

FIG. 1 shows an exploded perspective view of parts of a pair of hybrid circuit boards mounted using a supporting arrangement and electromagnetic shield according to the invention;

FIG. 2 is a cross-sectional view of the arrangement of FIG. 1, when fully assembled.

Referring to the drawings in detail, a rectangular baseboard 1 supports three upwardly projecting threaded studs 2, two of the studs located near one edge of the baseboard and the third near the opposite edge. A pair of hybrid microcircuits 3a, 3b are stacked on the baseboard 1. These microcircuits are formed on rectangular circuit boards 4a, 4b which are somewhat narrower than the baseboard 1. In FIG. 1 the microcircuits 3 are shown schematically as cross-hatched regions on end parts of the boards 4. The circuits 3 typically comprise discrete, thick-, and thin-film components incorporating active and passive devices. The circuits, which are formed on the board upper surfaces, have board-to-board interconnection leads 5 extending between terminals 6 at the boards ends. The upper board 4b is shorter than the lower board 4a in order to expose the terminals 6a. In the stacked position, the circuits on each of the boards are covered by a metal sheet which provides both a mechanical support and a radio frequency shield 7. The sheet material is a Cu(89%) Ni(9%) Sn(2%) alloy, 0.045" thick and quarter hard. The material provides an effective radio frequency interference shield in the frequency range 10 KHz to 100 MHz.

The rectangular shield 7 has flanges depending from opposed side edges. The flanges are divided into sections 9 and 10 by slots 11. Sections 9 have parts 12 turned under the shield 7 to embrace the associated circuit board edge and to space the shields 7 both from one another and from the baseboard 1 as shown in section in FIG. 2. Sections 10 have parts turned outwardly to produce tabs 13 which have locating holes 14 enabling the shields to be bolted onto the studs 2 by nuts 17. The turned-under parts 12 are soldered to zones 15 on the bottom surfaces of the boards to enable ground potential to be transferred between the circuits 3 and their associated shields. The flange sections 9 are made deep enough to accommodate components 18 projecting from the upper surface of their associated circuit board 4. The flange sections snugly embrace side edges of the associated circuit board 4 in a grip which is restraining but not so binding that the board cannot undergo slight movement. Consequently, where the individual boards 4 may be warped, or adjacent boards have reverse camber mating surface, or be thermally mismatched, any resulting stresses are absorbed by the supporting shield 7 and are not transmitted between the hybrid microcircuits.

Because the circuit boards are, in effect, retained in a floating position by the supporting shields 7, they can be located relatively closely to one another and to a heat sink (not shown) without introducing undue stresses during operation. The arrangement thus maximizes the use of available packing space. Because each of the microcircuits 3 are connected into the overall circuit only at terminals 6, at solder zones 15, and mechanically secured by means only of its associated shield 7 attached to studs 2, a circuit board/shield combination may be easily detached from the stack, and the board 4 extricated by melting the solder at the zones 15 and terminals 6.

The supporting shields offer appreciable immunity to radio frequency interference incident on the stacked boards 4. The choice of a shield material depends on the type and frequency of the interference. For high frequencies, the conductivity of the shield material must be correspondingly high; to combat magnetic interference, an alloy comprising 79% Ni, 5% Cu 17% Sn and 2% Cr provides an effective shield.

The shields 7 are readily formed by stamping rectangular preforms from sheet material and then shaping opposed edge regions using cooperating reciprocating dies.

The dispersed three-point contact afforded at studs 2 is considered to be optimal for the laterally extending boards 4 and shields 7 of the type described. Whereas the arrangement satisfactorily minimizes the freedom of movement of the shields, and thus the boards 4, relative to the baseboard 1, material stresses should not be introduced into the shield 7, and thus the boards 4, since the three fixture points must inevitably be coplanar; this is not the case with a four or more point contact or with arrangements having extensive contact areas.

Although a stack of only two circuit boards 4 is shown, the principle of the invention can be used to accomodate many more, the only requirement being a change in the flange formations 9 and 10. On the other hand, shields with identically formed flange formations can be used, but in this case spacers (not shown) should be located on the studs 2 between adjacent shields.

What is claimed is:

1. A combined supporting arrangement and electromagnetic interference shield for a plurality of circuit boards comprising:
    a baseboard, first fixture means formed on said baseboard and a plurality of circuit boards stacked on said baseboard, each circuit board shielded by a respective shield of conductive sheet material, each shield having flanges depending from opposed edge parts thereof, the flanges having turned-under parts and turned-out parts, the turned-under parts of any one of the shields embracing opposed edge parts of the circuit board shielded thereby and spacing that circuit board from an immediately underlying board, and the turned-out parts of any one of the shields formed with second fixture means engaging said first fixture means thereby clamping the shield to the baseboard.

2. A combined supporting arrangement and electromagnetic interference shield as claimed in claim 1, in which the first and second fixture means provide distributed three-point fixture of said shields to one another and to said baseboard.

3. A combined supporting arrangement and electromagnetic interference shield as claimed in claim 1, each shield being of rectangular form.

4. A combined supporting arrangement and electromagnetic interference shield as claimed in claim 3, in which one of the flanges depends from each of two opposed side edges of each shield, one of the turn-out parts being generally centrally located along one of the edges and second and third turned-out parts being located adjacent respective ends of the other edge.

5. A combined supporting arrangement and electromagnetic interference shield as claimed in claim 1 in which the shields are of identical cross-sectional form, and spacers located at said fixture means separate the turned-out parts of one shield from the turned-out parts of an adjacent shield.

6. A combined supporting arrangement and electromagnetic interference shield as claimed in claim 1, said conductive sheet material comprising an alloy of Cu, Ni and Sn.

7. A combined supporting arrangement and electromagnetic interference shield as claimed in claim 1, each shield particularly adapted to combat magnetic interference, said conductive sheet material comprising an alloy of Ni, Cu and Fe.

8. A combined supporting arrangement and electromagnetic interference shield as claimed in claim 3 in which each circuit board is longer than the shield by which it is shielded and is larger than any adjacent overlaying board in the stacked circuit boards thereby exposing an end region of the board at which are anchored interconnecting leads to other boards in the stack.

9. A combined supporting arrangement and electromagnetic interference shield as claimed in claim 1, in which a turned-under part of each shield flange is soldered to a conductive zone on an undersurface of the circuit board shielded thereby, whereby the shield is grounded.

* * * * *